United States Patent
Stirling-Gallacher

(10) Patent No.: US 7,327,796 B1
(45) Date of Patent: *__Feb. 5, 2008__

(54) SOVA TURBO DECODER WITH DECREASED NORMALISATION COMPLEXITY

(75) Inventor: Richard Stirling-Gallacher, Stuttgart (DE)

(73) Assignee: Sony Deutschland GmbH, Cologne (DE)

( * ) Notice: Subject to any disclaimer, the term of this patent is extended or adjusted under 35 U.S.C. 154(b) by 601 days.

This patent is subject to a terminal disclaimer.

(21) Appl. No.: 09/692,927

(22) Filed: Oct. 20, 2000

(30) Foreign Application Priority Data

Oct. 21, 1999   (EP)   ................... 99121070

(51) Int. Cl.
   *H04L 5/12*   (2006.01)
   *H04L 23/02*  (2006.01)
(52) U.S. Cl. .................. 375/262; 375/341; 714/795
(58) Field of Classification Search ................ 375/262, 375/265, 341; 714/795, 794, 796
See application file for complete search history.

(56) References Cited

U.S. PATENT DOCUMENTS

| | | | | |
|---|---|---|---|---|
| 5,721,745 A * | 2/1998 | Hladik et al. | ............... | 714/755 |
| 6,094,427 A * | 7/2000 | Yi | ............... | 370/331 |
| 6,487,694 B1 * | 11/2002 | Bajwa | ............... | 714/786 |
| 6,563,877 B1 * | 5/2003 | Abbaszadeh | ............... | 375/242 |
| 6,571,366 B1 * | 5/2003 | Doetsch et al. | ............... | 714/751 |
| 7,138,931 B2 * | 11/2006 | Ito et al. | ............... | 341/59 |

OTHER PUBLICATIONS

Z. Blazek and V.K. Bhargava: "A DSP-Based Implementation of a Turbo-Decoder" Proc. IEEE Global Telecommunications Conference (GLOBECOM 98), Nov. 8, 1998, pp. 2751-2755, XP000801545, Sydney, Australia.

* cited by examiner

*Primary Examiner*—Phuong Phu
(74) *Attorney, Agent, or Firm*—Oblon, Spivak, McClelland, Maier & Neustadt, P.C.

(57) ABSTRACT

To obtain best performance from a turbo decoder using a SOVA algorithm a normalization unit is used. By using normalization, the complexity of the decoder is increased. To decrease the complexity it is proposed not to normalize all of the decoding units output. In this way, computational complexity is reduced with only a small degradation in performance.

4 Claims, 5 Drawing Sheets

BER against iteration at $E_b/N_0$ = 2dB

BER against $E_b/N_0$ after 6 iterations.

SOVA TURBO DECODER WITH DECREASED NORMALISATION COMPLEXITY

BACKGROUND OF THE INVENTION

1. Field of the Invention

The present invention relates to a turbo decoder using a soft output Viterbi algorithm, a mobile communications device comprising such a turbo decoder as well as to a turbo decoding method using a soft output Viterbi algorithm (SOVA).

2. Description of Related Art

Turbo coding was first proposed by Berrou et al, "Near Shannon Limit Error-Correcting Coding and Decoding: Turbo-Codes", Proc. IEEE Conference on Communications (ICC 93), pages 1064 to 1070, 1993. There has been much interest in turbo coding due to the remarkable BER performance achievable. Turbo decoding combines the concepts of iterative decoding, soft in/soft out decoding, recursive systematic convolutional (RSC) encoding and random interleaving.

Turbo-coding (and the corresponding decoding) can either be performed as a parallel or serial concatenated scheme. The present invention relates to both schemes. For the parallel case the encoder consists of two or more encoding units which send coded interleaved and non-interleaved versions of the incoming data stream. FIG. 8 shows an example of encoders suitable for a parallel system using two encoding units.

For the case of the serial concatenated scheme two or more encoding units are used in series. The first encoding unit encodes the incoming data stream. (For the case of a coding scheme with two encoding units this encoder is referred to as the outer encoder). The output of this first encoding unit is then passed to an interleaver, the output of which then feeds the second encoding unit. The structure is then repeated for the number of encoding units in the system. FIG. 9 shows an example of a serial system using two encoding units (coder 1, coder 2).

A typical turbo decoder consists of two or more soft in/soft out decoders, which decode the encoded stream in an iterative loop. Two types of soft in/soft out decoders are commonly used, i.e. the maximum a posteriori (MAP) and the soft output Viterbi algorithm (SOVA). The MAP yields higher performance than the SOVA (for a given number of iterations) but with the drawback of higher complexity. In the frame work of the present invention only the SOVA turbo decoder is considered.

From U.S. Pat. No. 5,537,444 an extended list output and soft symbol output Viterbi algorithm is proposed.

As it is known from Papke, Robertson, "Improved Decoding with the SOVA in a Parallel Concatenated (Turbo-code) Scheme". Proc. IEEE Conference on Communications (ICC 96), pages 102 to 106, 1996, the extrinsic information produced by SOVA decoder is too optimistic. To improve performance it was suggested to multiply the extrinsic information at the output of each SOVA decoder by a normalisation factor. FIG. 3 shows a schematic representation of a parallel turbo decoder with normalisation units 27, 33 after each decoding unit 25 and 30 respectively.

In FIG. 5 a schematic representation of a serial turbo decoder is shown.

The normalisation factor for the decoding unit i is given by $$c_i = m_i \frac{2}{\sigma_i^2} \quad (1)$$

Where $m_i$ is the mean and $\sigma_i^2$ is the variance of the extrinsic information from the decoding unit i. As it comes clear from FIG. 3, the normalisation unit 27, 33 provided for every decoding unit 25 and 30, respectively, adds extra complexity (which increases with frame size) to the turbo decoder.

One method to reduce the complexity of normalisation techniques for a SOVA turbo decoder was proposed by Blazek et al, "A DSP-based Implementation of the Turbo Decoder", Proc. IEEE Global Telecommunications Conference (GLOBECOM 98), Sydney, Australia, pages 3201 to 3205, 1998. According to this technique a constant value for $c_i$ is used which increases with each iteration:

$$c_i = b_i + n a_i \quad (2)$$

Where $b_i$ is the base value, $a_i$ is the iteration increment and n is the iteration number. Although this method has very low complexity (there are no complex calculations required) suitable numbers have to be found which are good for all scenarios.

BRIEF SUMMARY OF THE INVENTION

It is the object of the present invention to further decrease the normalisation complexity for SOVA turbo decoders.

According to the present invention this object is achieved by means of the features of the independent claims. The dependent claims develop further the central idea of the present invention.

According to the present invention therefore a turbo decoder with at least two effective decoding units using a soft output Viterbi algorithm (SOVA) is used. "Two effective decoding units" means that in the hardware implementation either two or more decoding units are provided or that in the hardware implementation one decoding unit is used twice or more. The outputs of the decoding units are normalised by means of normalisation units. Thereby only a subset of the decoding units of the turbo decoder is provided with a normalisation unit at its output side.

The turbo decoder can comprise two decoding units, wherein only the first decoding unit is provided with the normalisation unit at its output side.

According to the present invention furthermore a mobile communications device comprising a turbo decoder as set forth above is provided.

According to another aspect of the present invention a turbo decoding method using a soft output Viterbi algorithm is proposed. A plurality of decoding units are used and outputs of the decoding units are normalised with a normalisation factor. Only a subset of the decoding units of the turbo decoder is normalised with a normalisation factor variable during operation, whereas the other decoding units are normalised with a time constant normalisation factor, which can be equal to 1.

Two decoding units can be used, wherein the first decoding unit is normalised with the normalisation factor variable during operation and the second decoding unit is normalised with the time constant normalisation factor.

The normalisation factors are calculated on the basis of the means and variance of the extrinsic information produced by the associated decoding unit. Alternatively a constant value increasing with each iteration can be used as time variable normalisation factor (as it is from Blazek et al).

The turbo decoding method can be performed as a parallel concatenated scheme.

Further features, advantages and particularities of the present invention will become evident by means of the following detailed description of an embodiment taken into conjunction with the figures of the enclosed drawings.

DETAILED DESCRIPTION OF THE INVENTION

Figure 1:
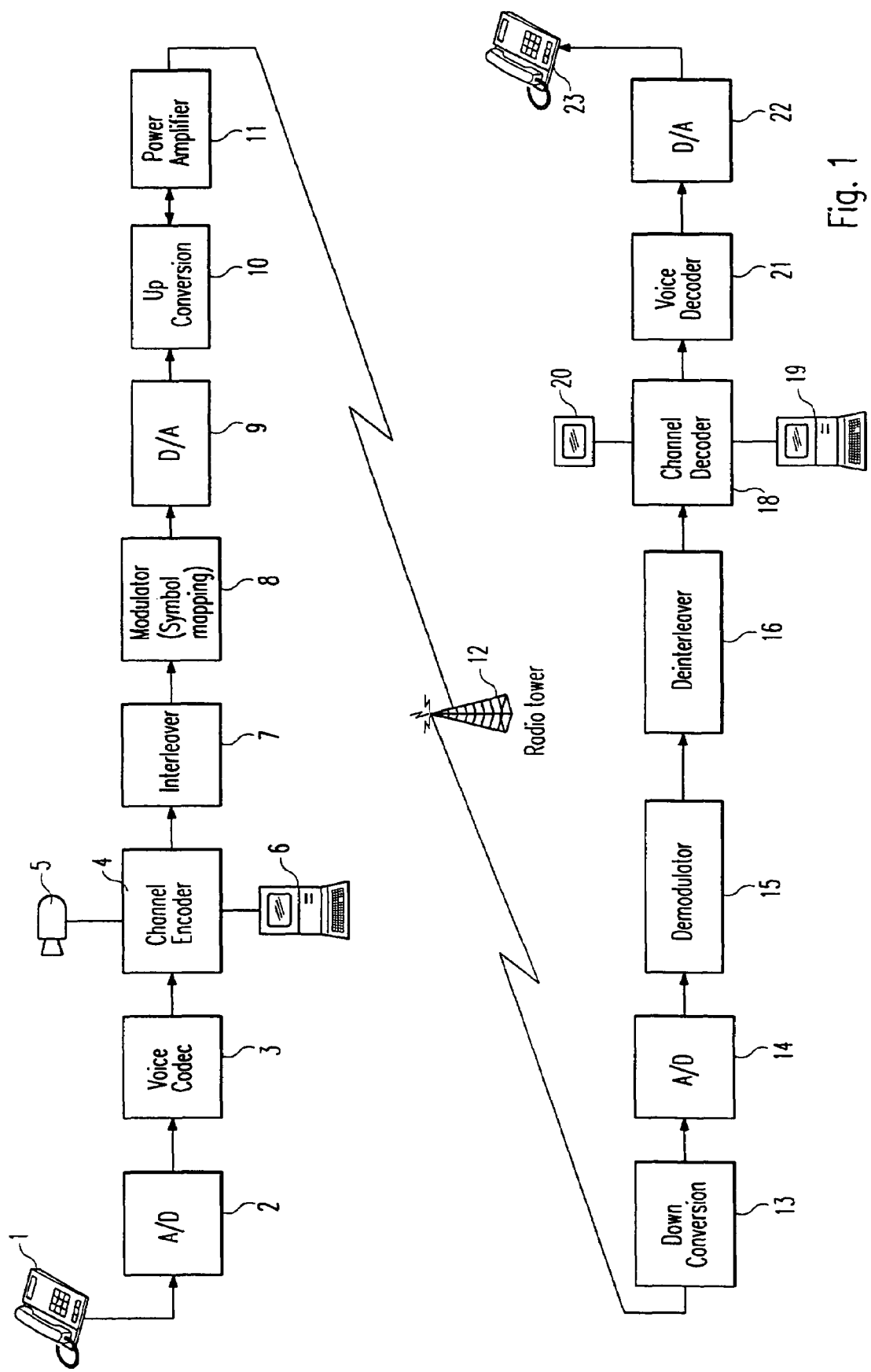
FIG. 1 shows schematically a wireless transmission chain, in which the present invention can be applied.

A transmission system according to the present invention will now be explained generally with reference to FIG. 1. As shown in FIG. 1, different data can be transmitted in a wireless manner. The data to be transmitted can comprise voice data from a telephone 1, 23, digital video data, for example, from a video camera 5 to be transmitted to a monitor 20 and other digital information data, as for example, data from a computer 6 to be transmitted to another computer 19. The analog voice data from a telephone 1 are A/D-converted 2, voice coded 3 and then supplied to a channel encoder 4. The data, for example, from a video camera 5 or from the computer 6 are also supplied to the channel encoder 4. The different data, for example, the voice data and the video data can be transmitted simultaneously. The data from the channel encoder 4 are given to a interleaver 7 and then supplied to a modulator 8 providing for a symbol mapping. The modulated data from modulator 8 are then D/A converted and up converted 10. The up converted data are amplified 11, and then transmitted over a wireless transmission path 12.

On the receiving side, the received data bit stream is downconverted in a baseband downconverter 13. The downconverted data output from the baseband downconverter 13 are digitised in an A/D converter 14 and input to a demodulator 15. The output of the demodulator 15 is passed through a deinterleaver 16, a channel decoder 18, a voice decoder 21 and is then D/A converted in a D/A converter 22. Finally the analog data is output on a terminal such as a telephone 23.

Obviously digital data can be supplied directly from the channel decoder 18 for example to a video monitor 20 or a computer terminal 19.

Figure 2:
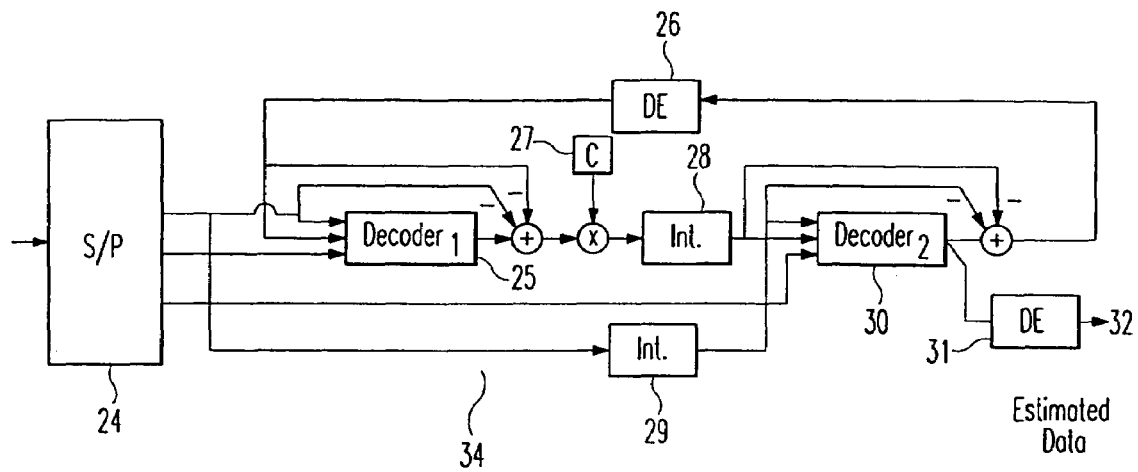
FIG. 2 shows a schematic representation of the present invention.
Figure 3:
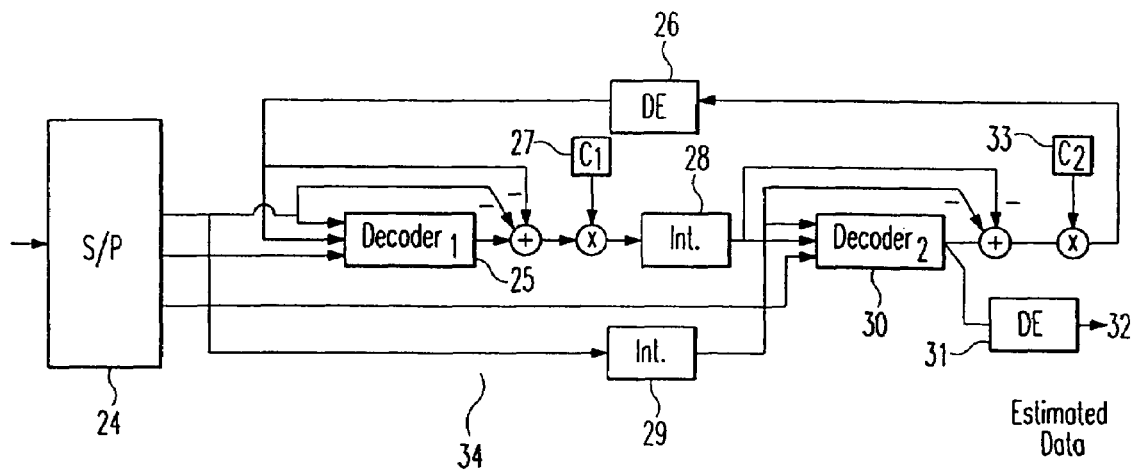
FIG. 3 shows a schematic representation of a known SOVA turbo decoder with normalisation units, operating according to the parallel scheme.

With reference to FIG. 2 a SOVA turbo decoder according to the parallel scheme will be explained.

The bit stream to be decoded is at first serially/parallel converted in a serial/parallel conversion unit 24. The output of the serial/parallel conversion unit 24 is supplied to a first decoding unit 25, to the output of the first decoding unit 25, to the input of a second decoding unit 30 as well as to the input of an interleaver 29. From the output of the first decoding unit 25 an output from an deinterleaver 26 as well as the input of the first decoding unit 25 are subtracted. The thus processed output of the first decoding unit 25 is then normalised by means of a normalisation unit 27 such that the processed output of the first decoding unit 25 is multiplied with a normalisation factor which is variable during the operation of the turbo decoder 34. The normalised output is supplied to an interleaver 28. The output of the interleaver 28 is supplied to the input of the second decoding unit 30 along with the output of the interleaver 29 and the serial/parallel converted data. From the output of the second decoding unit 30 the output of the first and second interleaver 28 and 29, respectively, is subtracted. The thus processed output of the decoding unit 30 is then fed back to a deinterleaver 26 and furthermore to the input and output side of the first decoding unit 25 as described above.

Note that it is not necessary two provide two decoding units in the hardware implementation. Two "effective" decoding units are sufficient. "Two effective decoding units" means that in the hardware implementation either two or more decoding units are provided or that in the hardware implementation one decoding unit is used twice or more.

The output signal of the second decoding unit 30 is furthermore supplied to deinterleaver 31. The estimated decoded data are provided at the output 32 of the deinterleaver 31.

As can be seen from FIG. 2, the normalisation unit 27 is only provided at the output side of the first decoding unit 25. No normalisation unit is provided for the second decoding unit 30.

The fact that no normalisation unit is provided for the second decoding unit 33 can also be expressed in that the output of the second decoding unit 33 is not normalised by a normalisation factor which is variable in time and/or operation of the SOVA turbo decoder.

Figure 4:
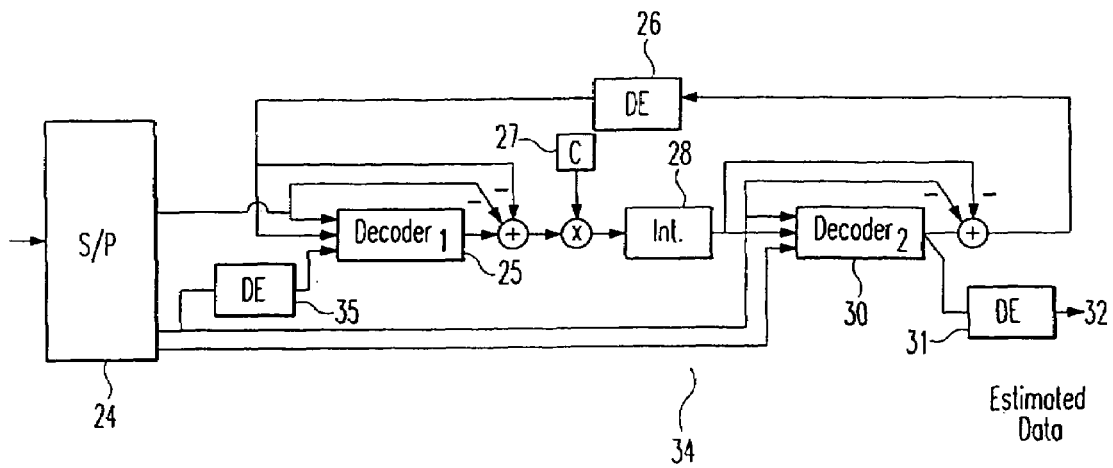
FIG. 4 shows a schematic representation of a SOVA turbo decoder with normalisation units operating according to the serial scheme.
Figure 5:
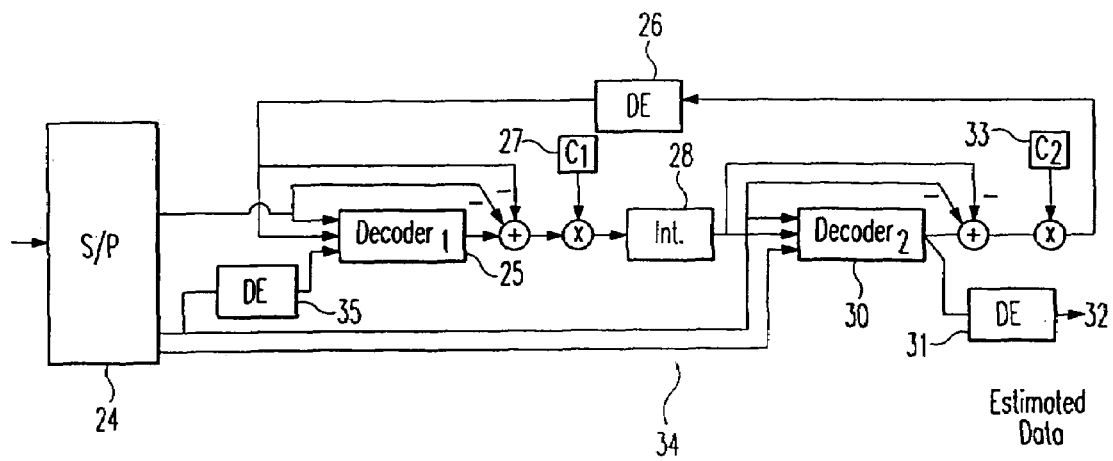
FIG. 5 shows a schematic representation of a known SOVA turbo decoder with normalisation units operating to the serial scheme.

FIG. 4 shows a SOVA turbo decoder according to the serial scheme. Note that in comparison to FIG. 2 (showing the parallel case) an additional deinterleaver 35 is provided. The interleaver 29 according to the example of FIG. 2 is omitted.

Therefore, only a subset of the SOVA outputs are normalised. The normalisation factor can be particularly:

$$c_1 = m_1 \frac{2}{\sigma_1^2} \tag{3}$$

$$c_2 = 1 \tag{4}$$

In this way the complexity of the SOVA turbo decoder can be reduced and since the correctly normalised extrinsic information from the decoding unit 27 is fed to the decoding unit 33 it also has an indirect effect on the extrinsic information produced by the decoding unit 33.

To investigate the performance of the proposed concept, simulations have been conducted in an AWGN channel. The parameters of the simulation are summarised in the following table 1:

| | |
|---|---|
| Coder connections | [1, N(D)/G(D) |
| | G(D) = 1 + $D^2$ + $D^3$ + $D^4$ |
| | N(D) = 1 + D + $D^2$ + $D^4$ |
| Code rate | ⅓ |
| Frame size | 1000 |
| Decoding window size | Whole frame |
| SOVA window size | 30 bits |
| SOVA update rule | Hagenauer |
| Interleaver type | Random |
| Iterations | 6 |

Figure 6:
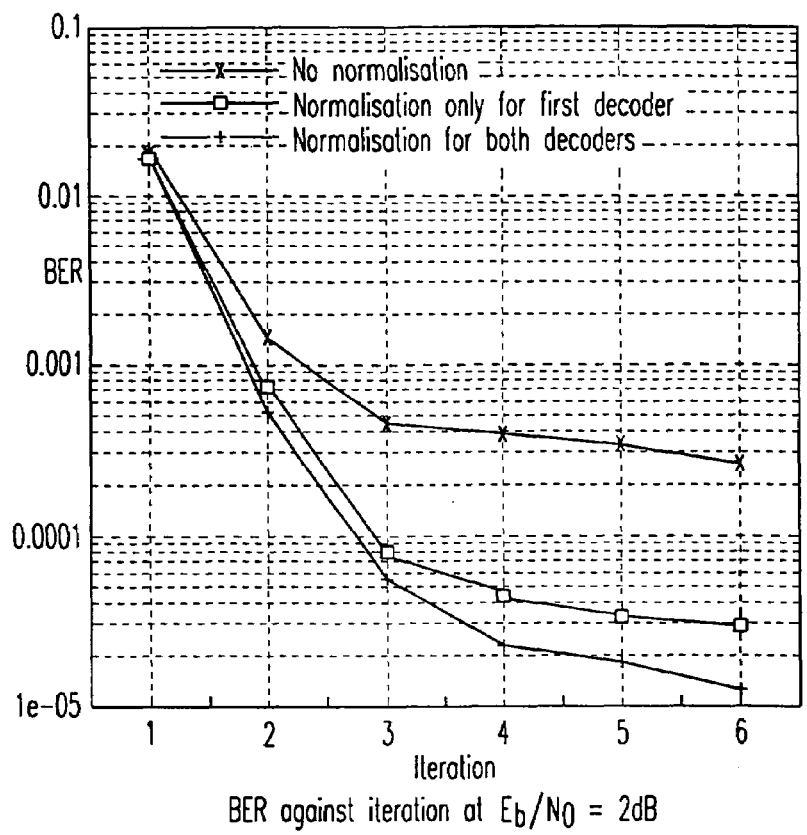
FIG. 6 shows the result of a simulation.
Figure 7:
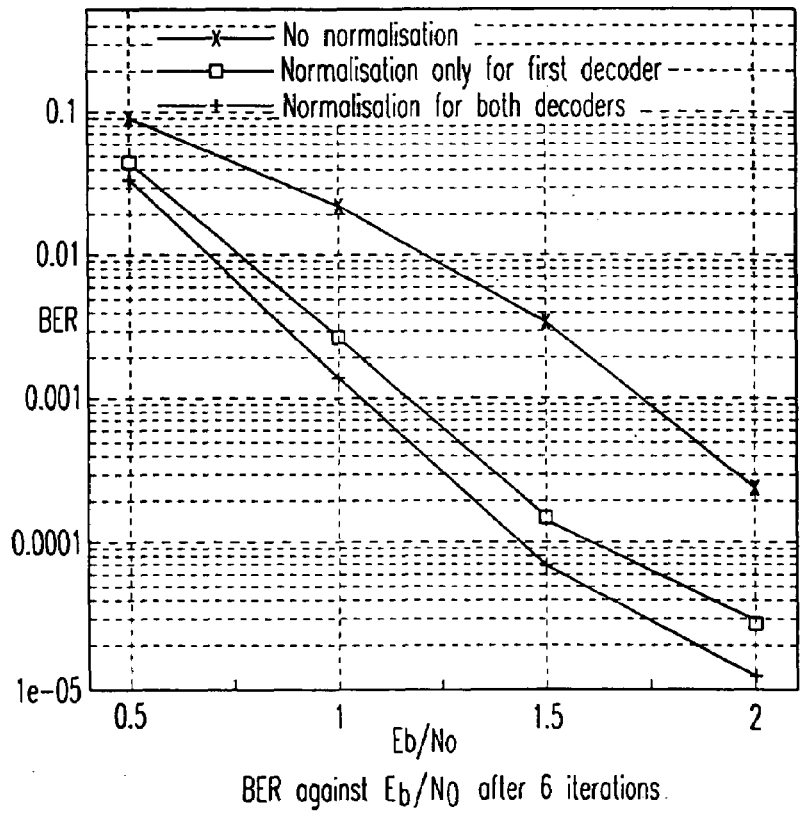
FIG. 7 shows a further simulation result to compare the effect of the present invention with the effects of the prior art techniques.
Figure 8:
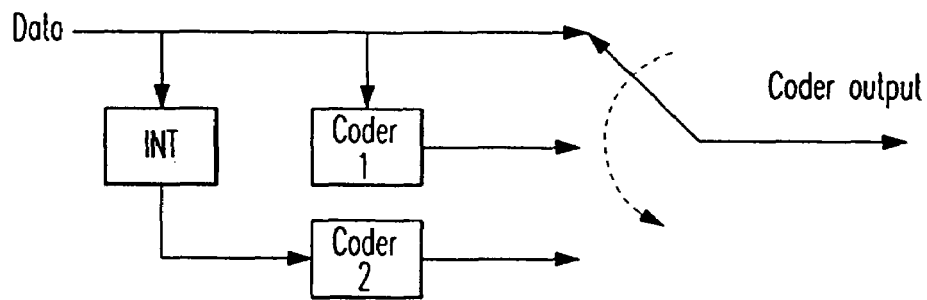
FIG. 8 shows schematically a parallel turbo encoder.
Figure 9:
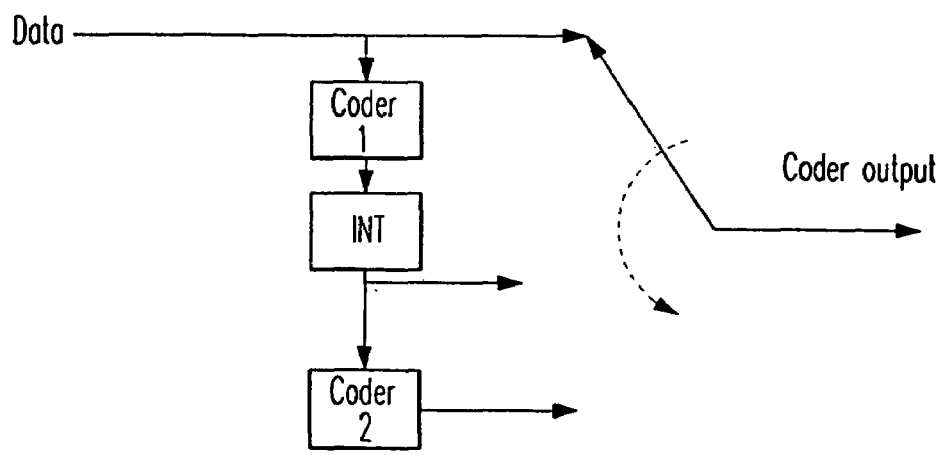
FIG. 9 shows schematically a serial turbo encoder.

Simulation results are shown in FIGS. 6 and 7. The BER for the SOVA without normalisation, with normal normalisation and with normalisation only for the first decoder are shown.

FIG. 6 shows the performance of the different normalisation scheme against iteration at 2 dB $E_b/N_0$. As can be seen by normalising only the first decoder there are no convergence problems. The performance is considerably improved over the no normalisation case and performance is extremely close to the traditional scheme of normalising both decoders.

FIG. 7 shows the BER against $E_b/N_0$ after 6 iterations. As can be seen at a BER of $3 \times 10^{-5}$ there is a 0.25 dB difference in the required $E_b/N_0$ between normalising both decoders and normalising only the first decoder. The difference between no normalisation and normalising both decoders is much greater.

It has been shown that normalising only a subset of the SOVA decoders in the turbo decoder yields very good performance. This concept my be used in certain situation where computational complexity needs to be reduced. In addition if the decoder is implemented as a parallel processing decoder the number of gates could be reduced. If the SOVA turbo decoder is to be used in a wide range of different situations (i.e. varying multipath channel) it may provide enhanced performance to the method suggested by Blazek et al but with the disadvantage of slightly increased complexity. The decision to use the technique or not, may depend upon the required BER. If for the parameters we have chosen a target BER below $5 \times 10^{-5}$ is required it may be preferable to use normalisation for both decoders since the number of iterations (and hence computational complexity) required is less than if only one decode: was normalised.

The present invention therefore describes a reduced complexity normalisation technique for the soft output Viterbi algorithm (SOVA) used in a turbo decoder. The normalisation is requires for the SOVA decoder because the extrinsic information generated is too optimistic. Traditional normalisation techniques involve calculating the mean and variance of the extrinsic information produced by all SOVA decoders in the turbo decoder. The new proposed technique performs this calculation for only a subset of the SOVA decoders.

It is important to note that the turbo decoder can consist of more than one decoder. It depends on how many decoders are used in the coder. Also more than two decoders may be used in the decoding loop. It is furthermore important to note the structure of the figures applied to the parallel concatenated coding case.

The invention claimed is:

1. A turbo decoder operative to use a soft output Viterbi algorithm, said turbo decoder comprising:
    a first soft output Viterbi algorithm (SOVA) decoding unit;
    a second SOVA decoding unit, wherein an output of the first SOVA decoding unit is connected to an input of the second SOVA decoding unit and an output of the second SOVA decoding unit is connected to an input of the first SOVA decoding unit; and
    a normalization unit, wherein an output of the normalization unit is connected to the output of the first SOVA decoding unit,
    wherein no normalization unit is provided between the output of the second SOVA decoding unit and the input of the first SOVA decoding unit.

2. A mobile communications device comprising a turbo decoder according to claim 1.

3. A turbo decoding method operative to use a soft output Viterbi algorithm, said turbo decoding method comprising the steps of:
    providing a first and second soft output Viterbi algorithm (SOVA) decoding unit, wherein an output of the first SOVA decoding unit is connected to an input of the second SOVA decoding unit and an output of the second SOVA decoding unit is connected to an input of the first SOVA decoding unit,
    normalizing first data obtained from the first SOVA decoding unit by connecting the output of a normalization unit to the output of the first SOVA decoding unit,
    wherein second data obtained from the second SOVA decoding unit is not normalized before being input to the input of the first SOVA decoding unit.

4. The turbo decoding method according to claim 3, wherein the first data obtained from use of the first SOVA decoding unit is normalized with a normalization factor variable during operation.

* * * * *

UNITED STATES PATENT AND TRADEMARK OFFICE
CERTIFICATE OF CORRECTION

PATENT NO. : 7,327,796 B1 Page 1 of 1
APPLICATION NO. : 09/692927
DATED : February 5, 2008
INVENTOR(S) : Stirling-Gallacher It is certified that error appears in the above-identified patent and that said Letters Patent is hereby corrected as shown below:

On the title page, Item (45) and the Notice Information should read:

-- (45) Date of Patent: Feb. 5, 2008

(*) Notice: Subject to any disclaimer, the term of this patent is extended or adjusted under 35 U.S.C. 154(b) by 601 days. --

Signed and Sealed this

Tenth Day of June, 2008

JON W. DUDAS
*Director of the United States Patent and Trademark Office*